United States Patent
Lee et al.

(10) Patent No.: US 10,115,759 B2
(45) Date of Patent: Oct. 30, 2018

(54) CMOS IMAGE SENSOR

(71) Applicant: SAMSUNG ELECTRONICS CO., LTD., Suwon-si (KR)

(72) Inventors: Youngbin Lee, Suwon-si (KR); GukHyon Yon, Hwaseong-si (KR); Soojin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/647,664

(22) Filed: Jul. 12, 2017

(65) Prior Publication Data

US 2018/0190691 A1 Jul. 5, 2018

(30) Foreign Application Priority Data

Dec. 30, 2016 (KR) .................. 10-2016-0183463

(51) Int. Cl.
*H01L 27/14* (2006.01)
*H01L 27/146* (2006.01)

(52) U.S. Cl.
CPC .... *H01L 27/1463* (2013.01); *H01L 27/14621* (2013.01); *H01L 27/14627* (2013.01); *H01L 27/14636* (2013.01); *H01L 27/14645* (2013.01); *H01L 27/14689* (2013.01)

(58) Field of Classification Search
CPC ............. H01L 27/14643; H01L 27/146; H01L 27/14621; H01L 27/14627; H01L 27/1463; H01L 27/1464; H01L 27/14641; H01L 27/14689; H01L 27/14636; H01L 27/14623; H01L 27/1462; H01L 27/14612; H01L 27/1461
See application file for complete search history.

(56) References Cited

U.S. PATENT DOCUMENTS

| 7,821,090 | B2 | 10/2010 | Akiyoshi |
| 8,445,950 | B2 | 5/2013 | Iida et al. |
| 9,054,007 | B2 | 6/2015 | Hu et al. |
| 9,419,039 | B2 | 8/2016 | Ahmed et al. |
| 9,496,304 | B2 | 11/2016 | Hu et al. |
| 2008/0265352 | A1 | 10/2008 | Akiyoshi |
| 2011/0156186 | A1* | 6/2011 | Iida .................. H01L 27/1463 257/432 |
| 2012/0248560 | A1* | 10/2012 | Lee ................. H01L 27/14627 257/432 |
| 2015/0048427 | A1 | 2/2015 | Hu et al. |
| 2015/0236058 | A1 | 8/2015 | Hu et al. |
| 2015/0279878 | A1* | 10/2015 | Ahmed ............. H01L 27/1463 257/446 |

(Continued)

FOREIGN PATENT DOCUMENTS

JP 2003142674 A * 5/2003 ........ H01L 27/14601
JP 2005-101864 A 4/2005

*Primary Examiner* — Charles Garber
*Assistant Examiner* — Abdulfattah Mustapha
(74) *Attorney, Agent, or Firm* — Sughrue Mion, PLLC (57) ABSTRACT

A complementary metal-oxide semiconductor (CMOS) image sensor includes a device isolation layer provided in a trench of a substrate, the device isolation layer defining a pixel; and a photoelectric conversion device provided in the pixel. The device isolation layer includes a conductive layer, a tunneling layer interposed between the conductive layer and the substrate, and a trap layer interposed between the tunneling layer and the conductive layer.

20 Claims, 8 Drawing Sheets

(56) References Cited

U.S. PATENT DOCUMENTS

| | | | |
|---|---|---|---|
| 2015/0333133 A1* | 11/2015 | Boettcher | H01L 29/404 |
| | | | 257/488 |
| 2016/0006965 A1 | 1/2016 | Lee et al. | |
| 2016/0035773 A1 | 2/2016 | Nah et al. | |
| 2016/0204142 A1 | 7/2016 | Um et al. | |
| 2016/0211288 A1 | 7/2016 | Yanagita et al. | |
| 2016/0225813 A1 | 8/2016 | Liao et al. | |

* cited by examiner

CMOS IMAGE SENSOR

CROSS-REFERENCE TO RELATED APPLICATION

This application claims priority under 35 U.S.C. § 119 from Korean Patent Application No. 10-2016-0183463, filed on Dec. 30, 2016, in the Korean Intellectual Property Office, the disclosure of which is incorporated herein by reference in its entirety.

BACKGROUND

Apparatuses and methods consistent with example embodiments relate to a complementary metal-oxide semiconductor (CMOS) image sensor, and in particular, to a CMOS image sensor with improved optical characteristics.

An image sensor is a semiconductor device that converts light into electrical signals. With the development of computer and communications industries, there is an increased demand for high performance image sensors in a variety of applications such as digital cameras, camcorders, personal communication systems, gaming machines, security cameras, micro-cameras for medical applications, and/or robots.

Image sensors may be generally classified into charge coupled device (CCD) and CMOS image sensors. The CMOS image sensors are operated using a simple operation method and are configured to have signal processing circuits integrated on a single chip, and thus, it is possible to realize products including scaled CMOS image sensors. In addition, CMOS image sensors may operate with relatively low consumption power, and thus, they are applicable to portable electronic devices. Furthermore, the CMOS image sensors may be fabricated using CMOS fabrication techniques, which may reduce manufacturing costs. Moreover, the CMOS image sensors may provide high resolution images. Accordingly, the use of CMOS image sensors is being increased.

SUMMARY

One or more example embodiments provide a CMOS image sensor with improved optical characteristics.

According to an aspect of an example embodiment, there is provided a CMOS image sensor including: a device isolation layer provided in a trench of a substrate, the device isolation layer defining a pixel; and a photoelectric conversion device provided in the pixel. The device isolation layer includes: a conductive layer; a tunneling layer interposed between the conductive layer and the substrate; and a trap layer interposed between the tunneling layer and the conductive layer. The trap layer is a silicon-containing conductive material.

According to an aspect of another example embodiment, there is provided a CMOS image sensor including: a device isolation layer provided in a trench of a substrate, the device isolation layer defining a pixel. The device isolation layer includes: a conductive layer; a tunneling layer interposed between the conductive layer and the substrate; and a trap layer interposed between the tunneling layer and the conductive layer. The trap layer includes a conductive material.

According to an aspect of yet another example embodiment, there is provided a method of manufacturing a CMOS image sensor, the method including: forming a trench in a substrate; conformally covering a surface of the trench with a tunneling layer; forming a trap layer on the tunneling layer; forming an insulation layer to conformally cover the trap layer; and forming a conductive layer on the insulation layer. The trap layer is formed a silicon-containing conductive material.

BRIEF DESCRIPTION OF THE DRAWINGS

The above and/or other aspects will be more clearly understood from the following description of example embodiments with reference to the accompanying drawings. The accompanying drawings represent non-limiting example embodiments as described herein.

It should be noted that these figures illustrate general characteristics of methods, structure and/or materials utilized in certain example embodiments to supplement the written description provided below. These drawings are not, however, to scale and may not precisely reflect the structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown.

Figure 1:
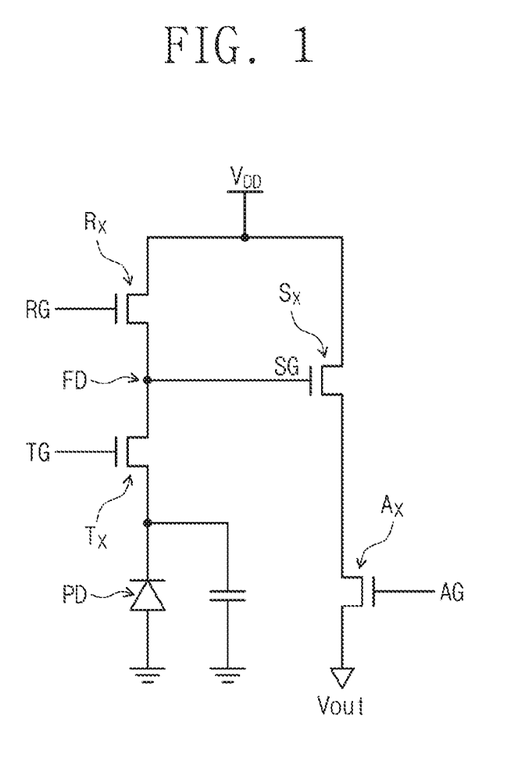
FIG. 1 is a circuit diagram of a CMOS image sensor according to one or more example embodiments.

FIG. 1 is a circuit diagram of a CMOS image sensor according to one or more example embodiments.

Referring to FIG. 1, the image sensor may include a plurality of pixels, each of which includes a photoelectric conversion device PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SG, a reset gate RG, and a selection gate AG, respectively. The photoelectric conversion device PD may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SG of the source follower transistor Sx. The source follower transistor Sx may be connected to the selection transistor Ax. The reset transistor Rx, the source follower transistor Sx, and the selection transistor Ax may be shared by adjacent pixels, and this makes it possible to increase an integration density of the image sensor.

Hereinafter, an operation of the image sensor will be described with reference to FIG. 1. Firstly, in a light-blocking state, if a power voltage VDD is applied to drain regions of the reset and source follower transistors Rx and Sx and the reset transistor Rx is turned on, electric charges may be discharged from the floating diffusion region FD. Thereafter, if the reset transistor Rx is turned off and light is incident on the photoelectric conversion device PD, electron-hole pairs may be generated in the photoelectric conversion device PD. Holes may be moved toward the p-type doped region, and electrons may be moved toward and accumulated in the n-type doped region. If the transfer transistor Tx is turned on, the electrons may be transferred to and accumulated in the floating diffusion region FD. A change in amount of the accumulated electrons may lead to a change in gate bias of the source follower transistor Sx, and this may lead to a change in source potential of the source follower transistor Sx. If the selection transistor Ax is turned on, an amount of the electrons may be read out as a signal to be transmitted through a column line.

Figure 2:
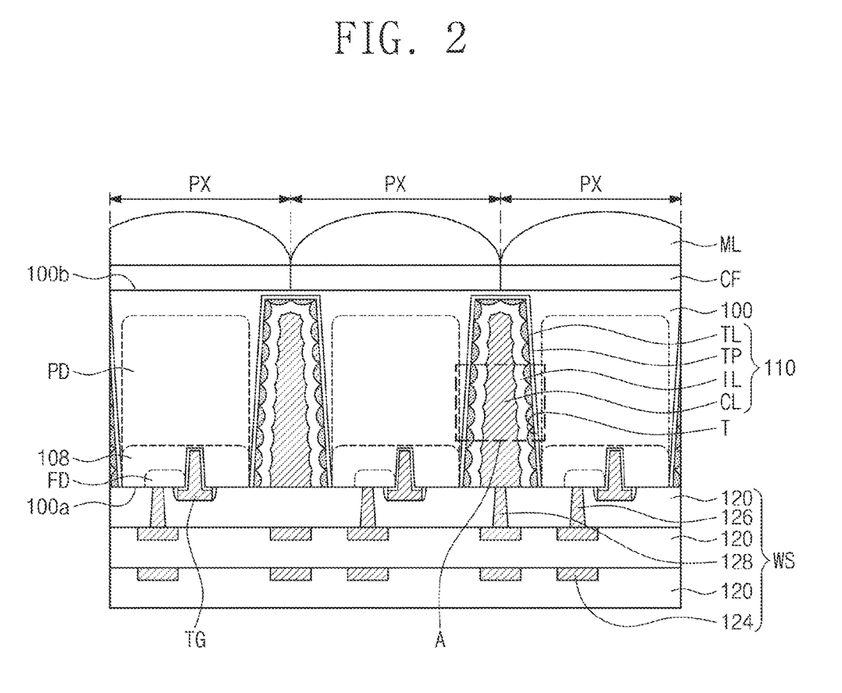
FIG. 2 is a sectional view illustrating a CMOS image sensor according to one or more example embodiments.
Figure 3A:
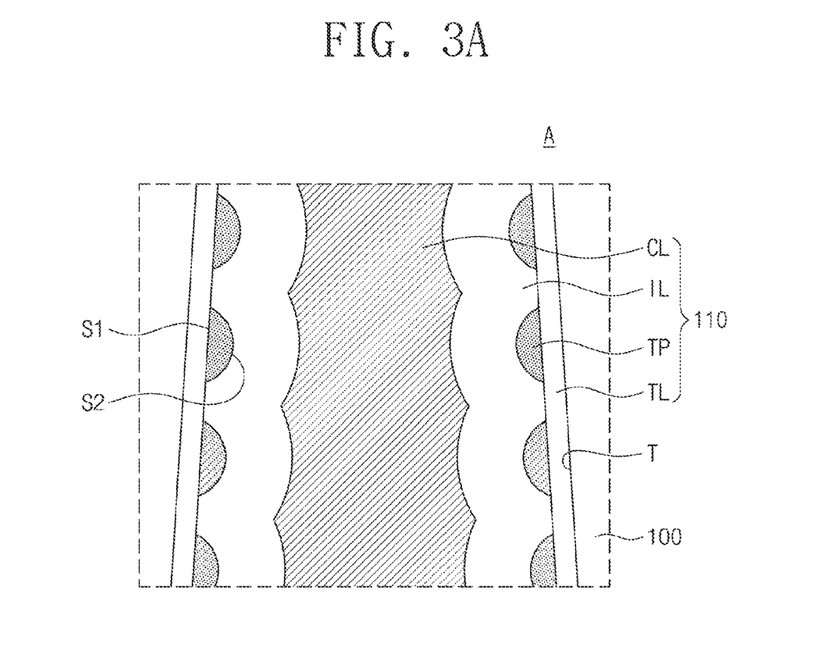
FIG. 3A is an enlarged view illustrating an example of a portion 'A' of FIG. 2.
Figure 3B:
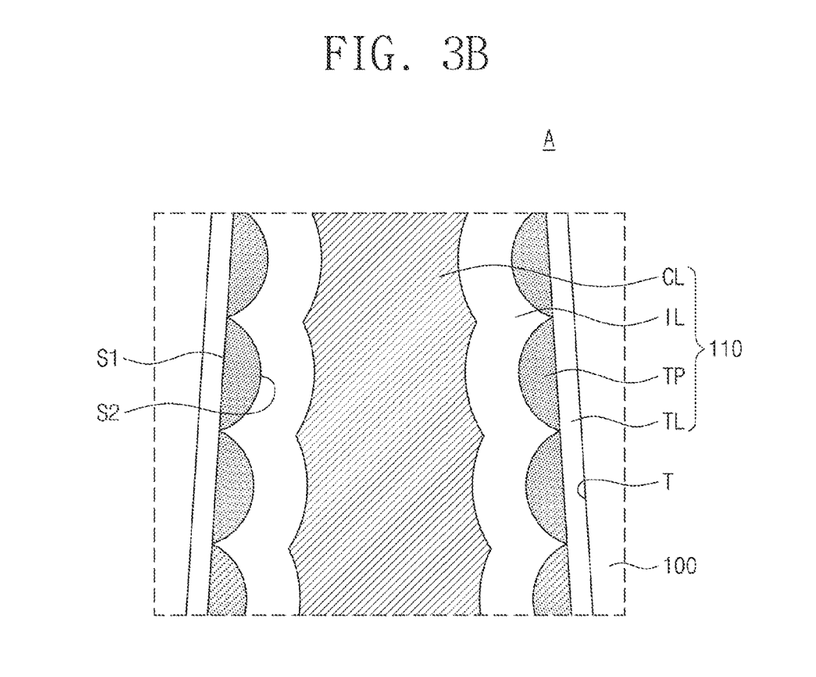
FIG. 3B is an enlarged view illustrating another example of the portion 'A' of FIG. 2.
Figure 4:
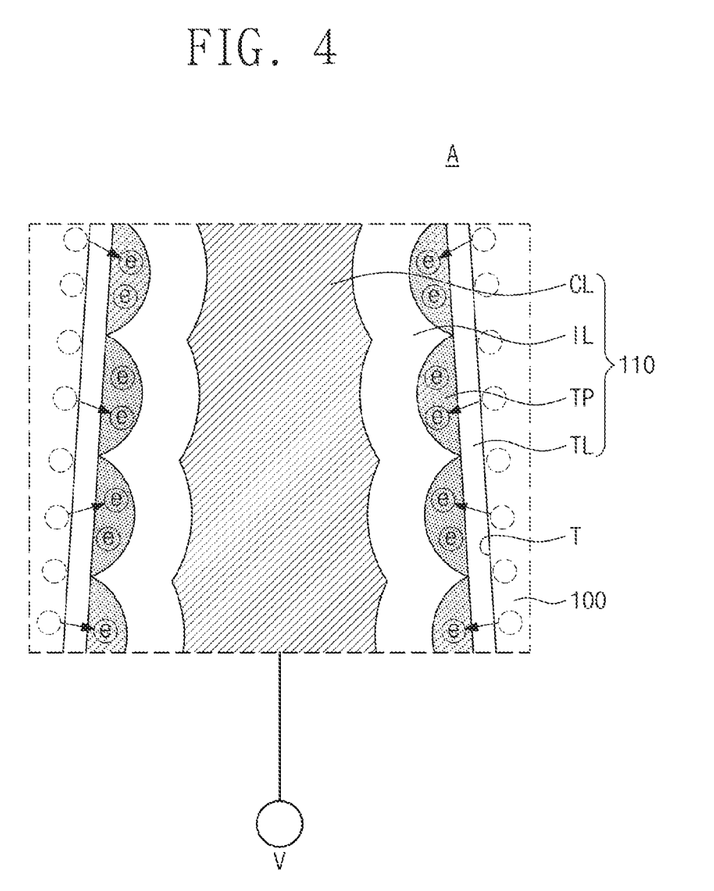
FIG. 4 is an enlarged view illustrating how electrons are trapped in trap patterns according to one or more example embodiments.
Figure 5:
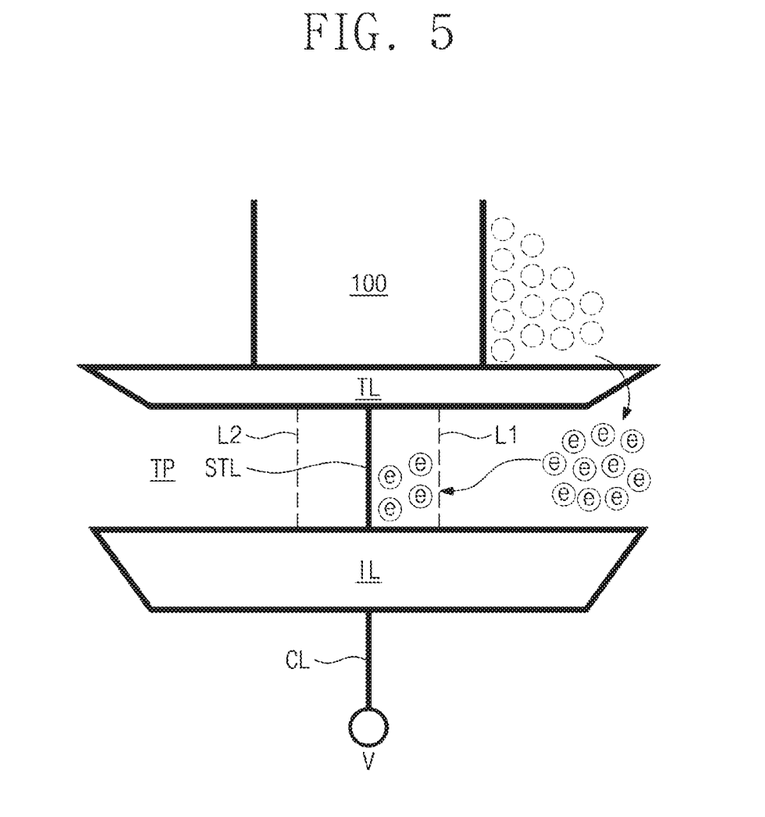
FIG. 5 is an energy band diagram of a device isolation layer according to one or more example embodiments.

FIG. 2 is a sectional view illustrating a CMOS image sensor according to one or more example embodiments. FIG. 3A is an enlarged view illustrating an example of a portion 'A' of FIG. 2. FIG. 3B is an enlarged view illustrating another example of the portion 'A' of FIG. 2. FIG. 4 is an enlarged view which illustrates the portion 'A' of FIG. 2 and is provided to explain how electrons are trapped in trap patterns. FIG. 5 is an energy band diagram of a device isolation layer according to one or more example embodiments.

Referring to FIG. 2, a substrate 100 may have a first surface 100a and a second surface 100b facing each other. The first surface 100a may be a top or front surface of the substrate 100, and the second surface 100b may be a bottom or rear surface of the substrate 100. The substrate 100 may be a silicon wafer, a germanium wafer, a silicon-germanium wafer, a II-VI compound semiconductor wafer, a III-V compound semiconductor wafer, or a silicon-on-insulator (SOI) wafer.

A device isolation layer 110 may be provided in the substrate 100. The device isolation layer 110 may define pixels PX of the substrate 100. The device isolation layer 110 may have a deep trench isolation (DTI) structure. The device isolation layer 110 may be provided in a trench T, which is recessed from the first surface 100a of the substrate 100.

The device isolation layer 110 may include a tunneling layer TL, a conductive layer CL, trap patterns TP, and an insulating layer IL. The tunneling layer TL may be provided to conformally cover a surface of the trench T. The tunneling layer TL may be formed of or include at least one of a silicon oxide layer, a thermal oxide layer, or a high-k dielectric material.

The conductive layer CL may be provided on the tunneling layer TL. The conductive layer CL may be formed of or include a conductive material. As an example, the conductive layer CL may include a poly silicon layer doped with impurities. The impurities may include, for example, phosphorus or boron. As another example, the conductive layer CL may be formed of or include at least one of metallic materials (e.g., tungsten) or metal nitrides (e.g., TiN).

The trap patterns TP may be placed between the tunneling layer TL and the conductive layer CL. The trap patterns TP may be arranged on a surface of the tunneling layer TL. The trap patterns TP may have a single-layer structure on the surface of the tunneling layer TL. As shown in FIG. 3A, the trap patterns TP may be spaced apart from each other, on the surface of the tunneling layer TL. Alternatively, as shown in FIG. 3B, the trap patterns TP may be in contact with each other, on the surface of the tunneling layer TL. In one or more example embodiments, some of the trap patterns TP, which are provided on the surface of the tunneling layer TL, may be in contact with each other, and the others may be spaced apart from each other. In one or more example embodiments, the trap patterns TP may be used as sites for trapping electrons that are positioned on a surface of the substrate 100 exposed by the trench T. This will be described in more detail below.

As shown in FIGS. 3A and 3B, each of the trap patterns TP may include a first surface S1, which is in contact with the tunneling layer TL, and a second surface S2, which is spaced apart from the tunneling layer TL. For example, the first surface S1 may be flat, and the second surface S2 may be convex. When viewed in a sectional view, each of the trap patterns TP may have a semi-circular shape. The trap patterns TP may be provided to have various sizes. For example, the trap patterns TP may have a size of several to several tens of nanometers. The trap patterns TP may be formed of or include a conductive material. As an example, the trap patterns TP may be formed of or include silicon or silicon doped with impurities. The impurities may include phosphorus or boron. In one or more example embodiments, the trap patterns TP may include a metallic material (e.g., gold (Au)).

The insulating layer IL may be provided between the trap patterns TP and the conductive layer CL. The insulating layer IL may have a uniform thickness. The insulating layer IL may be provided to fill a space between adjacent trap patterns TP. As an example, the insulating layer IL may be thicker than the tunneling layer TL and the trap patterns TP. The insulating layer IL may be formed of or include, for example, silicon oxide.

A photoelectric conversion device PD may be provided in each of the pixels PX. The photoelectric conversion device PD may include an n-type doped region. For example, the photoelectric conversion device PD may contain at least one of impurities (e.g., phosphorus, arsenic, bismuth, and antimony). A well region 108 may be provided in the photoelectric conversion device PD. For example, the well region 108 may be provided between the first surface 100a of the substrate 100 and the photoelectric conversion device PD. The well region 108 may be doped to have a conductivity type different from that of the photoelectric conversion device PD. For example, the well region 108 may be doped to have the p-type.

A floating diffusion region FD may be provided in the well region 108. The floating diffusion region FD may be placed to be close to the first surface 100a of the substrate 100. The floating diffusion region FD may be doped to have a conductivity type different from that of the well region 108. For example, the floating diffusion region FD may be an n-type doped region.

A transfer gate TG may be provided on the first surface 100a of the substrate 100. The transfer gate TG may be provided for each of the pixels PX. In one or more example embodiments, the transfer gate TG may include a portion inserted into the well region 108. For example, the transfer gate TG may be provided to have a T-shaped section. The transfer gate TG may be provided to be adjacent to the floating diffusion region FD.

A wiring structure WS may be provided on the first surface 100a of the substrate 100. The wiring structure WS may include a plurality of insulating layers 120, a plurality of wires 124, a plurality of first vias 126, and a second via 128, which are sequentially stacked on the first surface 100a of the substrate 100. The wires 124, the first vias 126, and the second via 128 may be provided in the insulating layers 120. Each of the first vias 126 may be in contact with the floating diffusion region FD and may be electrically connected to a corresponding one of the wires 124. The second via 128 may be in contact with the conductive layer CL of the device isolation layer 110 and may be electrically connected to at least one of the wires 124. Although only one of the second vias 128 is illustrated to be electrically connected to the conductive layer CL, example embodiments are not limited thereto. For example, a plurality of second vias 128 may be electrically connected to the conductive layer CL.

The following description of FIGS. 4 and 5 is presented to explain how electrons are trapped in the trap patterns.

Referring to FIG. 4, in the case where a surface of the substrate 100 is damaged during an etching process for forming the trench T, the surface of the substrate 100 may have interface defects (e.g., dangling bonds) which act as sources of electrons (e). In the case where the presence of the electrons (e) causes erroneous output as a part of an optical signal, a dark current noise issue may occur. For example, there may occur distortion of a dark image.

In one or more example embodiments, if high positive voltage V is applied to the conductive layer CL through the second via 128, due to an electric field produced by the positive voltage V, some of electrons (e) may pass through the tunneling layer TL and may be trapped in the trap patterns TP. As a result, the trap patterns TP may be negatively charged with the electrons (e). In one or more example embodiments, the electrons (e) may be trapped in the trap patterns TP by applying a positive voltage to the conductive layer CL once. Owing to the tunneling layer TL and the insulating layer IL, which are provided at both sides of each of the trap patterns TP, the electrons (e) may not escape from the trap patterns TP, until a negative voltage is applied to the conductive layer CL. Thus, it may be possible to prevent the pixel PX from suffering from a dark current issue caused by electrons (e) and consequently to improve optical characteristics of the CMOS image sensor.

As shown in FIG. 5, the type or concentration of dopants or impurities in the trap patterns TP may be changed to control bandgap properties of the trap patterns TP, and consequently control the retention time of the electrons (e) in the trap patterns TP. For example, in the case where the trap patterns TP are doped with phosphorus, the trap patterns TP may have an energy level L1 that is higher than an energy level STL of an un-doped trap pattern, where the energy level may be a Fermi level. In this case, electrons (e) may be easily trapped in the trap patterns TP, but they may easily escape from the trap patterns TP to the pixel PX. That is, the retention time of the electrons (e) may be reduced.

In contrast, if the trap patterns TP are doped with boron, the trap patterns TP may have an energy level L2 that is lower than the energy levels STL of the un-doped trap pattern. In this case, it may be hard to discharge electrons (e) trapped in the trap patterns TP to the pixel PX. That is, the retention time of the electrons (e) may be increased.

Referring back to FIG. 2, color filters CF may be provided on the second surface 100b of the substrate 100. Each of the color filters CF may be provided to face a corresponding one of the photoelectric conversion devices PD. The color filters CF may include green filters, blue filters, and red filters. As an example, the color filters CF may be arranged to form a Bayer-type arrangement. In the Bayer-type arrangement, the green filters, to which human eye is most sensitive, may be arranged to occupy half of the color filters CF.

Micro lenses ML may be disposed on the color filters CF. Each of the micro lenses ML may be provided to face a corresponding one of the photoelectric conversion devices PD.

Figure 6:
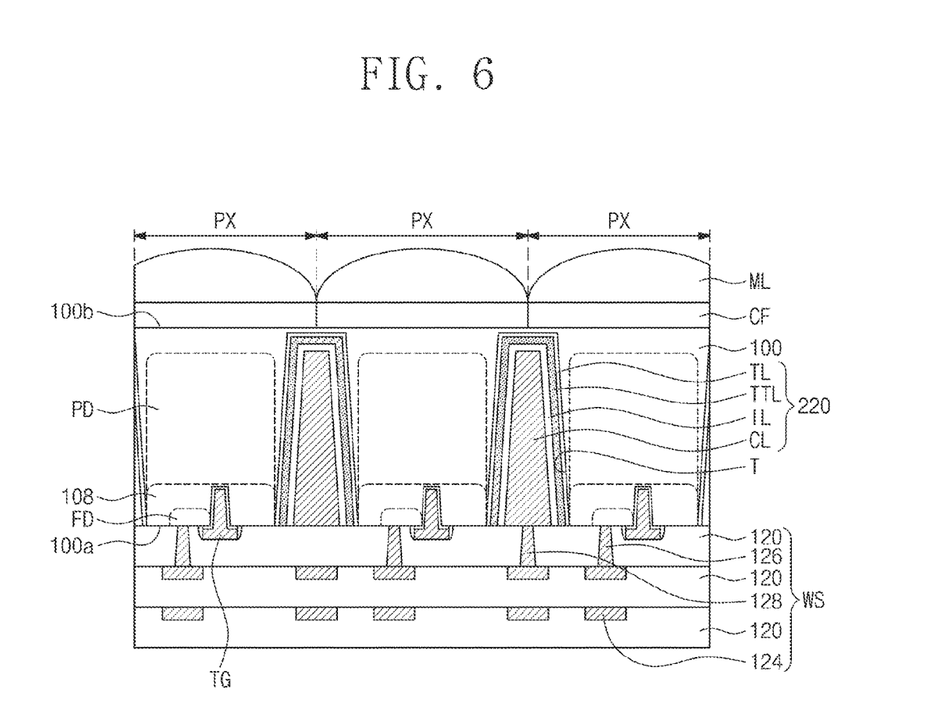
FIG. 6 is a sectional view illustrating a CMOS image sensor according to one or more example embodiments.

FIG. 6 is a sectional view illustrating a CMOS image sensor according to one or more example embodiments. For concise description, elements previously described with reference to FIG. 2 may be identified by a similar or identical reference number without repeating an overlapping description thereof.

Referring to FIG. 6, a device isolation layer 220 according to one or more example embodiments may include a trap layer TTL, in addition to the tunneling layer TL, the conductive layer CL, and the insulating layer IL. The tunneling layer TL may be provided to conformally cover the trench T, and the conductive layer CL may be provided on the tunneling layer TL. The insulating layer IL may be interposed between the tunneling layer TL and the conductive layer CL.

The trap layer TTL may be interposed between the tunneling layer TL and the insulating layer IL. The trap layer TTL may be formed to conformally cover the tunneling layer TL. The trap layer TTL may be formed of or include a conductive material. As an example, the trap layer TTL may be formed of or include silicon, doped silicon, poly silicon, or doped poly silicon. The doped silicon or the doped poly silicon may contain phosphorus or boron. In one or more example embodiments, the trap layer TTL may be formed of or include a metallic material (e.g., gold (Au)).

Figure 7A:
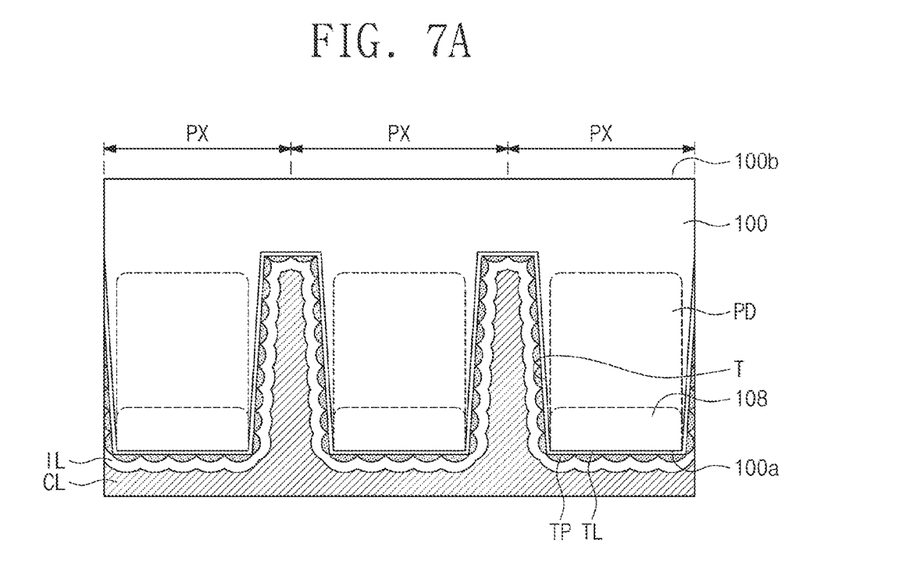
FIGS. 7A, 7B and 7C are sectional views illustrating a method of fabricating a CMOS image sensor, according to one or more example embodiments.
Figure 7B:
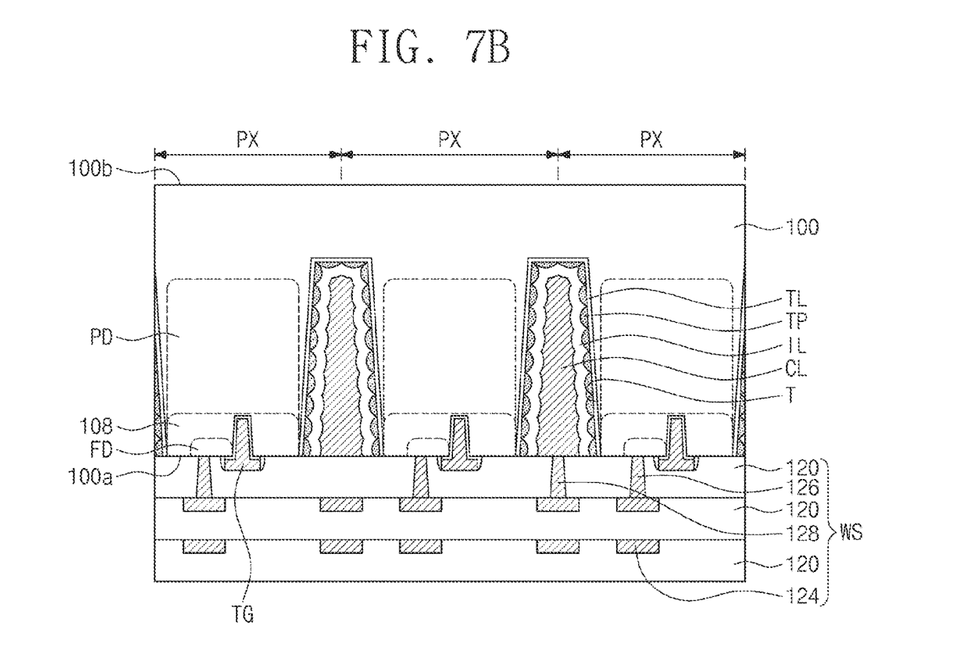
Figure 7C:
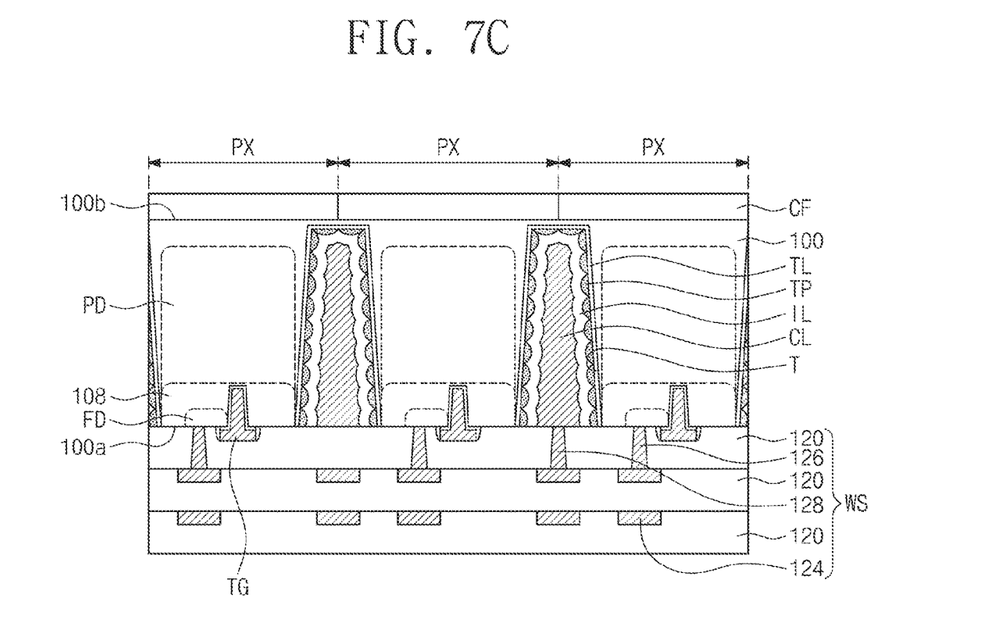

FIGS. 7A, 7B and 7C are sectional views illustrating a method of fabricating a CMOS image sensor, according to one or more example embodiments.

Referring to FIG. 7A, the substrate 100 may have first and second surfaces 100a and 100b facing each other. The substrate 100 may be a silicon wafer, a germanium wafer, a silicon-germanium wafer, a II-VI compound semiconductor wafer, a III-V compound semiconductor wafer, or a silicon-on-insulator (SOI) wafer.

The photoelectric conversion device PD may be formed in the substrate 100. The photoelectric conversion device PD may be formed by an ion implantation process of injecting dopants into the substrate 100 through the first surface 100a. The photoelectric conversion device PD may be doped with n-type impurities. The well region 108 may be formed in the photoelectric conversion device PD. The well region 108 may be formed to be interposed between the first surface 100a of the substrate 100 and the photoelectric conversion device PD. The well region 108 may be formed by an ion implantation process of injecting impurities into the substrate 100 through the first surface 100a. For example, the well region 108 may be formed by doping the substrate 100 with p-type impurities.

The trench T may be formed in the substrate 100. For example, the trench T may be formed by partially recessing the first surface 100a of the substrate 100. The trench T may be formed to have a bottom surface adjacent to the second surface 100b of the substrate 100. When viewed in a plan view, the trench T may be formed to have a mesh shape and to define the pixels PX of the substrate 100. The photoelectric conversion device PD and the well region 108 may be provided in each of the pixels PX.

The tunneling layer TL may be formed to conformally cover the surface of the trench T and the first surface 100a of the substrate 100. The tunneling layer TL may be formed by, for example, a chemical vapor deposition (CVD) method or an atomic layer deposition (ALD) method. The tunneling layer TL may be formed of or include at least one of a silicon oxide layer, a thermal oxide layer, or a high-k dielectric material.

In one or more example embodiments, the trap patterns TP may be formed on the tunneling layer TL. For example, the trap patterns TP may be formed of or include doped silicon or silicon. In one or more example embodiments, the trap patterns TP may be formed of or include a metallic material (e.g., gold (Au)). The formation of the trap patterns TP may include performing a surface treatment process on the tunneling layer TL and then supplying a precursor onto the surface of the tunneling layer TL. The surface treatment process may be performed in such a way that an OH group is formed on the surface of the tunneling layer TL. The precursor may contain a material which can be reacted with the OH group, and thus, the trap patterns TP, which are results of the reaction between the precursor and the OH group, may be deposited on the surface of the tunneling layer TL. A material, which does not participate in the reaction, may be removed. In the case where the trap patterns TP are formed of silicon, the precursor may be diisoprophylaminosilane (DIPAS), bis(tertiary-butylamino) silane (BTBAS), or hexachlorodisilane (HCDS). In one or more example embodiments, impurities may also be supplied during the supplying of the precursor, and in this case, the trap patterns TP may be doped with impurities. The impurities may be phosphorus or boron.

The surface treatment process on the tunneling layer TL may include treating the surface of the tunneling layer TL with ultraviolet (UV) light or ozone. In the case where there is an OH group on the surface of the tunneling layer TL, the surface treatment process on the tunneling layer TL may be omitted. In one or more example embodiments, each of the trap patterns TP may be formed by solidifying the precursor, which is supplied in a gaseous state and is adsorbed on the surface of the tunneling layer TL, and thus, it may have a shape when it is adsorbed on the tunneling layer TL. As an example, when viewed in a sectional view, the trap patterns TP may be formed to have a semi-circular shape.

In one or more example embodiments, as shown in FIG. 6, the trap layer TTL may be formed on the surface of the tunneling layer TL. The trap layer TTL may be formed to conformally cover the tunneling layer TL. As an example, the trap layer TTL may be formed of or include doped silicon, silicon, doped poly silicon, or poly silicon. The doped silicon or the doped poly silicon may contain phosphorus or boron. In one or more example embodiments, the trap layer TTL may be formed of or include a metallic material (e.g., gold (Au)). The trap layer TTL may be formed by, for example, a chemical vapor deposition (CVD) method or an atomic layer deposition (ALD) method.

Referring back to FIG. 7A, the insulating layer IL may be formed to conformally cover surfaces of the trap patterns TP. The insulating layer IL may be formed to be thicker than the tunneling layer TL and the trap patterns TP. The insulating layer IL may be formed by, for example, a chemical vapor deposition (CVD) method or an atomic layer deposition (ALD) method. The insulating layer IL may be formed of or include, for example, silicon oxide.

The conductive layer CL may be formed on the insulating layer IL. The conductive layer CL may be formed to fill the remaining space of the trench T. The conductive layer CL may be formed by, for example, a chemical vapor deposition (CVD) method or an atomic layer deposition (ALD) method. In one or more example embodiments, the conductive layer CL may include poly silicon. A doping process may be performed to dope the conductive layer CL with impurities, and this may make it possible to increase electric conductivity of the conductive layer CL. The impurities may be phosphorus or boron. The doping process may be performed using, for example, an ion implantation process or a rapid thermal annealing process. In one or more example embodiments, the conductive layer CL may be formed of or include a metallic material. For example, the formation of the conductive layer CL may include sequentially forming a metal nitride layer and a metal layer on the insulating layer IL. The metal nitride layer may include, for example, titanium nitride (TiN), and the metal layer may include, for example, tungsten (W).

Referring to FIG. 7B, a planarization process may be performed on the conductive layer CL, the insulating layer IL, the trap patterns TP, and the tunneling layer TL, until the first surface 100a of the substrate 100 is exposed. Thus, the tunneling layer TL, the trap patterns TP, the insulating layer IL, and the conductive layer CL may be locally formed within the trench T.

The floating diffusion region FD may be formed in the well region 108. The floating diffusion region FD may be formed to be adjacent to the first surface 100a of the substrate 100. The floating diffusion region FD may have a conductivity type different from that of the well region 108 and may be formed by a doping process. The floating diffusion region FD may be formed to contain, for example, n-type impurities. The transfer gate TG may be formed on the first surface 100a of the substrate 100. The transfer gate TG may be placed at a side of the floating diffusion region FD. A portion of the transfer gate TG may be inserted into the well region 108. The transfer gate TG may be formed of or include at least one of metallic materials.

The wiring structure WS may be formed on the first surface 100a of the substrate 100. The wiring structure WS may include a plurality of insulating layers, the wires 124, the first vias 126, and the second via 128. Each of the first vias 126 may be in contact with, and electrically connected to, the floating diffusion region FD. The second via 128 may be in contact with, and electrically connected to, the conductive layer CL. The wires 124 may be electrically connected to the first vias 126 and the second via 128.

Referring to FIG. 7C, a polishing process may be performed on the second surface 100b of the substrate 100 to reduce a thickness of the substrate 100. For example, as shown in FIG. 7C, the polishing process on the substrate 100 may be performed in such a way that the tunneling layer TL is not exposed on the bottom surface of the trench T. In one or more example embodiments, the polishing process on the substrate 100 may be performed to expose the tunneling layer TL covering the bottom surface of the trench T. The polishing process may include, for example, a chemical mechanical polishing (CMP) process or a grinding process.

A color filter CF may be formed on the second surface 100b of the substrate 100. In each of the pixels PX, the color filter CF may be formed to face the photoelectric conversion device PD.

Referring back to FIG. 2, a micro lens ML may be formed on the color filter CF. The micro lens ML may be formed to face the photoelectric conversion device PD.

According to one or more example embodiments, an image sensor may include a device isolation layer, which is provided in a trench to define pixels. The device isolation layer may include a tunneling insulating layer, a conductive layer on the tunneling insulating layer, and a trap layer between the tunneling insulating layer and the conductive layer. If a positive voltage is applied to the conductive layer, electrons on the trench may pass through the tunneling insulating layer and may be trapped in the trap layer. Thus, it may be possible to prevent the pixel from suffering from a dark current issue caused by the electrons, and consequently improve optical characteristics of the image sensor.

While example embodiments have been particularly shown and described, it will be understood by one of ordinary skill in the art that variations in form and detail may be made therein without departing from the spirit and scope of the attached claims.

What is claimed is:

1. A complementary metal-oxide semiconductor (CMOS) image sensor, comprising:
   a device isolation layer provided in a trench of a substrate, the device isolation layer defining a pixel; and
   a photoelectric conversion device provided in the pixel,
   wherein the device isolation layer comprises:
      a conductive layer;
      a tunneling layer interposed between the conductive layer and the substrate; and
      a trap layer interposed between the tunneling layer and the conductive layer, the trap layer defining a plurality of trap patterns, each of the plurality of trap patterns having a flat surface in contact with the tunneling layer and a non-flat surface spaced apart from the tunneling layer, and
   wherein the trap layer is a silicon-containing conductive material.

2. The CMOS image sensor of claim 1, wherein the CMOS image sensor is configured to apply a positive voltage to the conductive layer.

3. The CMOS image sensor of claim 1, wherein the trap layer is formed of one from among silicon, doped silicon, poly silicon, and doped poly silicon.

4. The CMOS image sensor of claim 1, wherein the trap layer comprises one from among phosphorus and boron.

5. The CMOS image sensor of claim 1, wherein the conductive layer comprises at least one from among doped poly silicon and a metallic material.

6. The CMOS image sensor of claim 1, wherein the device isolation layer further comprises an insulating layer interposed between the trap layer and the conductive layer.

7. The CMOS image sensor of claim 6, wherein a first thickness of the insulating layer is greater than a second thickness of the trap layer and a third thickness of the tunneling layer.

8. The CMOS image sensor of claim 1, wherein a first surface of the substrate is substantially parallel with a second surface of the substrate, and
   wherein the CMOS image sensor further comprises:
      a transfer gate provided on the first surface of the substrate;
      a micro lens provided on the second surface of the substrate; and
      a color filter interposed between the micro lens and the second surface of the substrate.

9. A complementary metal-oxide semiconductor (CMOS) image sensor, comprising:
   a device isolation layer provided in a trench of a substrate, the device isolation layer defining a pixel,
   wherein the device isolation layer comprises:
      a conductive layer;
      a tunneling layer interposed between the conductive layer and the substrate; and
      a trap layer interposed between the tunneling layer and the conductive layer,
   wherein the trap layer defines a plurality of trap patterns, each of the plurality of trap patterns having a flat surface in contact with the tunneling layer and a non-flat surface spaced apart from the tunneling layer, and
   wherein the trap layer comprises a conductive material.

10. The CMOS image sensor of claim 9, wherein the trap layer is formed of one from among silicon, doped silicon, poly silicon, and doped poly silicon.

11. The CMOS image sensor of claim 9, wherein the trap layer comprises a metallic material.

12. The CMOS image sensor of claim 9, wherein the CMOS image sensor is configured to apply a positive voltage to the conductive layer.

13. The CMOS image sensor of claim 9, further comprising an insulating layer interposed between the trap layer and the conductive layer,
   wherein the tunneling layer comprises at least one from among a first silicon oxide layer, a thermal oxide layer, and a high-k dielectric material, and
   wherein the insulating layer comprises a second silicon oxide layer.

14. The CMOS image sensor of claim 9, further comprising an insulating layer interposed between the trap layer and the conductive layer,
   wherein a first thickness of the insulating layer is greater than a second thickness of the trap layer and a third thickness of the tunneling layer.

15. The CMOS image sensor of claim 9, wherein a first surface of the substrate is substantially parallel with a second surface of the substrate, and
   wherein the CMOS image sensor further comprises:
      a transfer gate provided on the first surface of the substrate;
      a micro lens provided on the second surface of the substrate; and
      a color filter interposed between the micro lens and the second surface of the substrate.

16. The CMOS image sensor of claim 9, wherein the pixel comprises a photoelectric conversion device provided in the pixel, and
   wherein the trap layer comprises a silicon-containing conductive material.

17. A method of manufacturing a complementary metal-oxide semiconductor (CMOS) image sensor, the method of manufacturing comprising:
   forming a trench in a substrate;
   conformally covering a surface of the trench with a tunneling layer;
   forming a trap layer on the tunneling layer, the trap layer defining a plurality of trap patterns, each of the plurality of trap patterns having a flat surface in contact with the tunneling layer and a non-flat surface spaced apart from the tunneling layer;
   forming an insulation layer to conformally cover the trap layer; and
   forming a conductive layer on the insulation layer,
   wherein the trap layer is formed a silicon-containing conductive material.

18. The method of manufacturing of claim 17, further comprising planarizing the conductive layer, the insulating layer, the plurality of trap patterns, and the tunneling layer, until a first surface of the substrate is exposed.

19. The method of manufacturing of claim 18, further comprising forming a floating diffusion region in a well region of the substrate;

forming a transfer gate on the first surface of the substrate; and forming a wiring structure comprising a plurality of first vias and a second via, the second via being connected to the conductive layer.

20. The method of manufacturing of claim 19, wherein the forming the trap layer comprises using one from among a chemical vapor deposition (CVD) method and an atomic layer deposition (ALD), wherein the conformally covering the surface of the trench with the tunneling layer comprises one from among the CVD method and the ALD method, and wherein the forming the conductive layer comprises using one from among the CVD method and the ALD method.

* * * * *